United States Patent
Lin et al.

(10) Patent No.: US 11,552,638 B2
(45) Date of Patent: Jan. 10, 2023

(54) OPTICAL SWITCH MODULE AND CONTROL METHOD THEREOF

(71) Applicant: ASUSTEK COMPUTER INC., Taipei (TW)

(72) Inventors: Kuo-En Lin, Taipei (TW); Chih-Yuan Lin, Taipei (TW); Shih-Hung Chou, Taipei (TW); Xin-Han Cai, Taipei (TW); I-Ting Hsieh, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 17/344,440

(22) Filed: Jun. 10, 2021

(65) Prior Publication Data

US 2021/0391860 A1    Dec. 16, 2021

(30) Foreign Application Priority Data

Jun. 10, 2020  (CN) .......................... 202010523502.8

(51) Int. Cl.
*H03K 17/969* (2006.01)
*G06F 3/02* (2006.01)
*H03K 17/94* (2006.01)

(52) U.S. Cl.
CPC ............. *H03K 17/969* (2013.01); *G06F 3/02* (2013.01); *H03K 17/943* (2013.01)

(58) Field of Classification Search
None
See application file for complete search history.

(56) References Cited

U.S. PATENT DOCUMENTS

2016/0124525 A1* 5/2016 Hsu ........................ G06F 3/0383
                                                    345/163
2021/0202193 A1* 7/2021 Lee ........................ H03K 17/969

FOREIGN PATENT DOCUMENTS

| CN | 106656146 A | 5/2017 |
|----|-------------|--------|
| CN | 207039562 U | 2/2018 |
| CN | 109672437 A | 4/2019 |

OTHER PUBLICATIONS

Machine translation for CN109672437, Chen et al, Apr. 2019, Google Patents, all pages (Year: 2019).*

* cited by examiner

*Primary Examiner* — Daniel C Puentes
(74) *Attorney, Agent, or Firm* — Muncy, Geissler, Olds & Lowe, P.C.

(57) ABSTRACT

An optical switch module including a light generation circuit, a light receiving circuit, and a control unit is provided. The light generation circuit includes a light generation unit and a control end, and generates light according to a control signal from the control end. The light receiving circuit includes a light receiving unit and a signal reading end, and is configured to receive light to generate a detection signal at the signal reading end. The control unit is configured to generate the control signal and receive the detection signal. The control unit further selectively configures the signal reading end in an input mode or an output mode. Before the control unit configures the signal reading end in the input mode to read the detection signal, the control unit configures the signal reading end in the output mode to pull up a potential of the light receiving unit.

8 Claims, 3 Drawing Sheets

OPTICAL SWITCH MODULE AND CONTROL METHOD THEREOF

CROSS-REFERENCE TO RELATED APPLICATION

This application claims the priority benefit of Chinese Application Serial No. 202010523502.8, filed on Jun. 10, 2020. The entirety of the above-mentioned patent application is hereby incorporated by reference herein and made a part of specification.

BACKGROUND OF THE INVENTION

Field of the Invention

The disclosure relates to an input device, and in particular, to an optical switch module applied to an input device and a control method thereof.

Description of the Related Art

The optical switch is a micro-switch technology developed from the conventional mechanical keyboard. In the technology, a light-emitting diode and an infrared optical sensor replace a metallic elastic piece in the structure of a conventional mechanical switch. The two ways that an open circuit and a closed circuit, are formed by applying the light sensing principle to trigger a key signal. An optical switch keyboard has advantages such as strong interference resistance, steady operation, and a long service life.

FIG. 1A and FIG. 1B are waveform diagrams of operation of a conventional optical switch. FIG. 1A corresponds to a case that a key is not pressed. FIG. 1B corresponds to a case that a key is pressed. In the figures, the upper waveform corresponds to a voltage level of a high-voltage end of a light-emitting diode, and the lower waveform corresponds to a voltage level of a high-voltage end of an infrared optical sensor.

First, at a time point T1, it is necessary to wait until the infrared sensor restores a steady state. At a time point T2, the light-emitting diode is activated. After the infrared sensor reaches the steady state, at a time point T3, a signal of the infrared sensor is detected first to determine a key state, and then the light-emitting diode is switched off to complete the key read procedure.

As shown in the figures, after the light-emitting diode of the optical switch keyboard is switched off, the light-emitting diode is allowed to activate again when the infrared optical sensor reaches the steady state.

Similarly, after the light-emitting diode is switched on, the detection of a key operation performs when the infrared optical sensor reaches the steady state. Besides, the light-emitting diode stays on for a long time and causes high power consumption. Therefore, the conventional optical switch keyboard has problems of slow detection and high power consumption.

BRIEF SUMMARY OF THE INVENTION

The disclosure provides an optical switch module applied to an input device. The optical switch module includes a light generation circuit, a light receiving circuit, and a control unit. The light generation circuit includes a light generation unit and a control end. The light generation unit generates light according to a control signal from the control end.

The light receiving circuit includes a light receiving unit and a signal reading end. The light receiving unit is configured to receive light from the light generation unit to generate a detection signal at the signal reading end. The control unit is electrically connected to the control end and the signal reading end to generate the control signal at the control end and receive the detection signal at the signal reading end.

The control unit further selectively configures the signal reading end in an input mode or an output mode. Before the control unit configures the signal reading end in the input mode to read the detection signal, the control unit configures the signal reading end in the output mode to pull up a potential of the light receiving unit.

The disclosure further provides an optical switch module control method, applied to an optical switch module. The optical switch module includes a light generation circuit and a light receiving circuit. The light generation circuit includes a light generation unit and a control end and generates light according to a control signal from the control end. The light receiving circuit includes a light receiving unit and a signal reading end. The light receiving circuit is configured to receive light from the light generation unit to generate a detection signal at the signal reading end.

The control method includes steps of configuring the signal reading end in an output mode to pull up a potential of the light receiving unit; configuring the signal reading end in an input mode to prepare to read the detection signal; activating the light generation unit through the control signal to generate light; when the light receiving unit reaches a steady state, reading the detection signal through the signal reading end to determine a key state; and switching off the light generation unit.

The optical switch module and the control method thereof provided in the disclosure effectively shorten the preparation time of the light receiving unit and increase the overall detection speed of the input device, thereby shortening the activation time of the light generation unit, and reducing the energy consumption of the input device.

DETAILED DESCRIPTION OF THE EMBODIMENTS

Embodiments of the disclosure are described in further detail below with reference to the accompanying drawings. The advantages and features of the disclosure are described more clearly according to the following description and claims. It is to be noted that all of the drawings use very simplified forms and imprecise proportions, which are only used for assisting in conveniently and clearly explaining the objective of the embodiments of the disclosure.

Figure 1A:
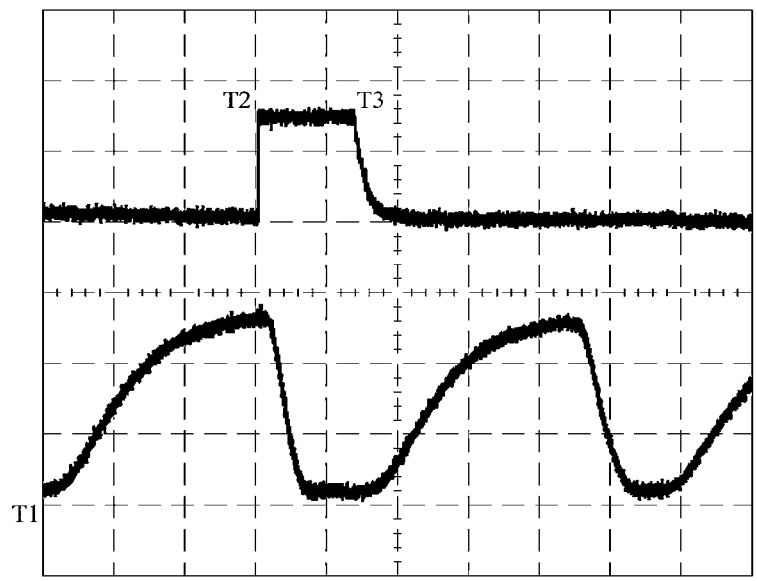
FIG. 1A and FIG. 1B are waveform diagrams of operation of a conventional optical switch.
Figure 1B:
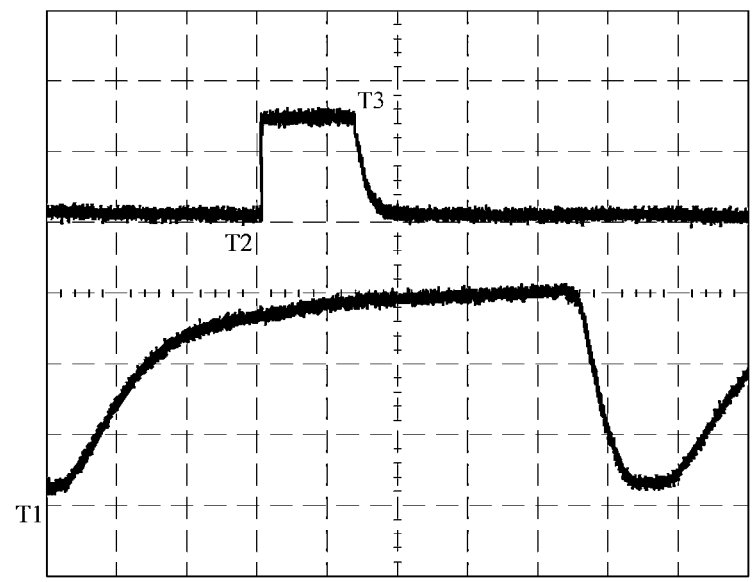
Figure 2:
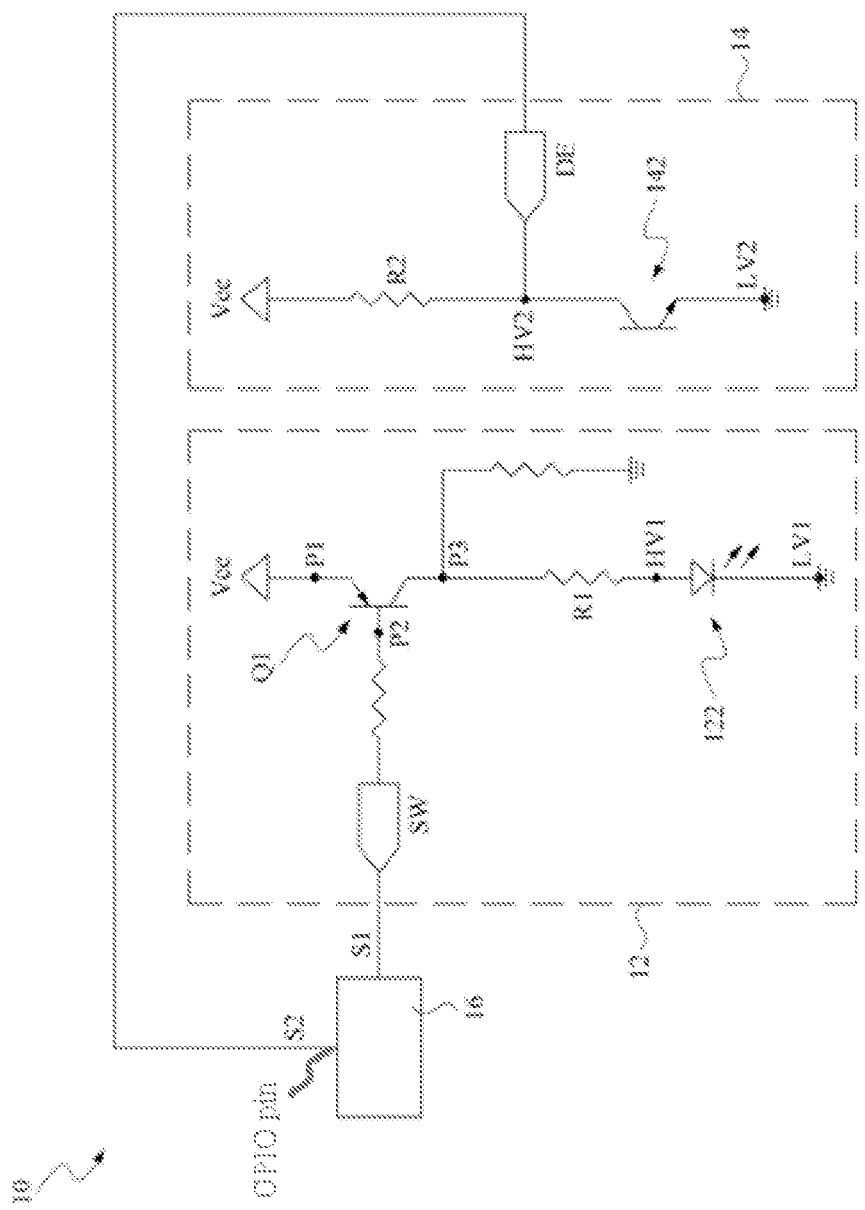
FIG. 2 is a schematic block diagram of an optical switch module according to an embodiment of the disclosure.

FIG. 2 is a schematic block diagram of an optical switch module according to an embodiment of the disclosure. The optical switch module 10 is applied to an input device, such as a keyboard or a mouse.

As shown in the figure, the optical switch module 10 includes a light generation circuit 12, a light receiving circuit 14, and a control unit 16.

The light generation circuit 12 includes a light generation unit 122 and a control end SW. The light generation unit 122 generates light according to a control signal S1 from the control end SW. In an embodiment, the light generation unit 122 is an infrared light-emitting diode. In an embodiment, the light generation unit 122 is a visible light light-emitting diode.

In an embodiment, as shown in the figure, the light generation circuit 12 further includes a switching element Q1. The switching element Q1 includes a first end P1, a second end P2, and a third end P3. The first end is electrically connected to a power supply end VCC. The second end P2 is electrically connected to the control end SW. The third end P3 is electrically connected to a high-voltage end HV1 of the light generation unit 122. A low-voltage end LV1 of the light generation unit 122 is connected to ground.

The switching element Q1 is under control of the control signal S1 to selectively transmit power of the power supply end VCC to the light generation unit 122, so that the light generation unit 122 emits light. In an embodiment, the light generation circuit 12 further includes a first resistor R1.

Two ends of the first resistor R1 are electrically connected to the third end R3 of the switching element Q1 and the high-voltage end HV1 of the light generation unit 122 respectively, to limit a current flowing through the light generation unit 122. In an embodiment, the value of the first resistor R1 is less than or equal to 100 ohms, to improve the luminance and activation speed of the light generation unit 122.

The light receiving circuit 14 includes a light receiving unit 142 and a signal reading end DE. The light receiving unit 142 is configured to receive light from the light generation unit 122 to generate a detection signal S2 at the signal reading end DE. In an embodiment, the light receiving unit 142 is a phototransistor. In an embodiment, the light receiving unit 142 is an infrared sensor.

In an embodiment, as shown in the figure, the light receiving circuit 14 further includes a second resistor R2. Two ends of the second resistor R2 are electrically connected to a high-voltage end HV2 of the light receiving unit 142 and the power supply end VCC respectively, to limit a current flowing through the light receiving unit 142.

In an embodiment, the value of the second resistor R2 is less than or equal to 4.7 k ohms, to shorten a time it takes for the light receiving unit 142 to reach a steady state. A low-voltage end LV2 of the light receiving unit 142 is connected to ground.

The signal reading end DE is located at a circuit between the second resistor R2 and the light receiving unit 142. In other words, a potential of the signal reading end DE corresponds to a potential of the high-voltage end HV2 of the light receiving unit 142.

The control unit 16 is electrically connected to the control end SW and the signal reading end DE, to generate the control signal S1 at the control end SW, so that the signal reading end DE receives the detection signal S2.

The control unit 16 further selectively configures the signal reading end DE in an input mode or an output mode. Before the control unit 16 configures the signal reading end DE in the input mode to read the detection signal S2, the control unit 16 configures the signal reading end DE in the output mode to pull up the potential of the high-voltage end HV2 of the light receiving unit 142, that is, to pull up the potential of the signal reading end DE.

In an embodiment, the control unit 16 is a micro-control unit (MCU) provided with a general-purpose input/output (GPIO) pin. The operation mode of the GPIO pin is controlled to be adjusted to an input mode or an output mode.

In an embodiment, the output mode is a push-pull mode. In an embodiment, the output mode is an open-drain mode. The input mode is a mode in which the control unit 16 reads an external signal (such as the detection signal S2).

Figure 3A:
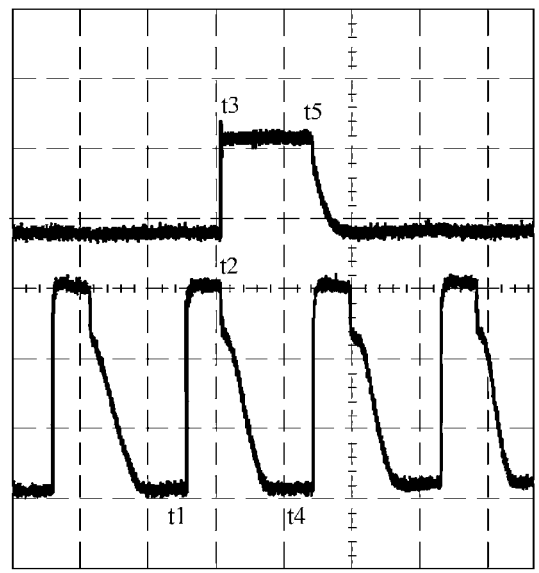
FIG. 3A and FIG. 3B are waveform diagrams of operation of the optical switch module in FIG. 2.
Figure 3B:
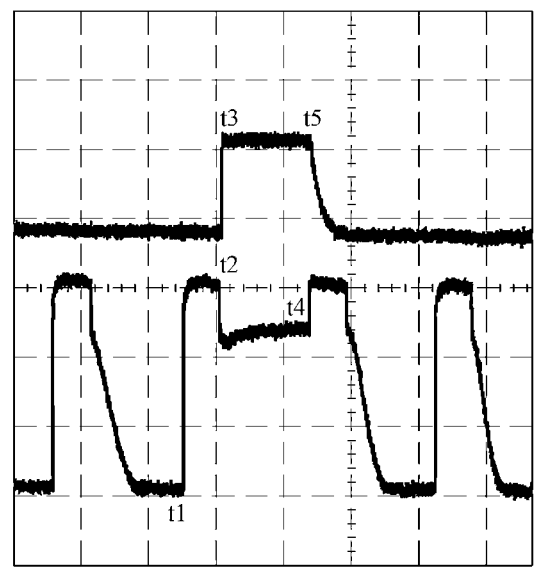

FIG. 3A and FIG. 3B are waveform diagrams of operation of the optical switch module 10 in FIG. 2. FIG. 3A corresponds to a case that a key is not pressed. FIG. 3B corresponds to a case that a key is pressed.

In the figures, the upper waveform corresponds to a voltage level of the high-voltage end HV1 of the light generation unit 122. The lower waveform corresponds to a voltage level of the high-voltage end HV2 of the light receiving unit 142. That is, a voltage level of the signal reading end DE. As shown in the figure, a control method of the optical switch module 10 is as follows:

First, at a time point t1, the control unit 16 configures the signal reading end DE in the output mode to pull up the potential of the high-voltage end HV2 of the light receiving unit 142, to shorten a time it takes for the light receiving unit 142 to reach a steady state.

Then at a time point t2, the control unit 16 configures the signal reading end DE in the input mode to prepare to read the detection signal S2. The time interval between the time point t2 and the time point t1 depends on the capability of the control unit 16 to pull up the potential of the signal reading end DE.

In an embodiment, the control unit 16 configures the signal reading end DE in a push-pull mode to the time interval between the time t2 and the time t1. In another embodiment, as shown in the figures, after pulling the potential of the signal reading end DE up close to a steady-state potential, the control unit 16 configures the signal reading end DE in the input mode, to ensure that the signal reading end DE reads the detection signal S2 smoothly.

Next, at a time point t3, the control unit 16 activates, through the control signal S1, the light generation unit 122 to generate light. After the light generation unit 122 generates the light, the control unit 16 waits for the light receiving unit 142 to reach the steady state (at a real time point t4). Then the control unit 16 reads the detection signal S2 to determine whether a user presses a key, and switches off the light generation unit 122 (at a real time point t5) after reading is completed, to reduce energy consumption.

In an embodiment, the control unit 16 determines, according to the potential change of the signal reading end DE, whether the light receiving unit 142 reaches the steady state, or reads the detection signal S2 after waiting a preset time according to attributes of the light receiving unit 142, to ensure that the light receiving unit 142 reaches the steady state.

In the foregoing embodiments, the step that the control unit 16 configures the signal reading end DE in the input mode and the step that the control unit 16 activates, through the control signal S1, the light generation unit 122 to generate light are performed in sequence.

In an embodiment, the step that the control unit 16 configures the signal reading end DE in the input mode and the step that the control unit 16 activates, through the control signal S1, the light generation unit 122 to generate light are performed at the same time to increase the detection speed.

Based on the above, the optical switch module 10 and the control method thereof provided in the disclosure effectively shorten the preparation time of the light receiving unit 142 and increase the overall detection speed of the input device, thereby shortening the activation time of the light generation unit 122, and reducing the energy consumption of the input device.

Although the disclosure is described with reference to the above embodiments, the embodiments are not intended to limit the disclosure. A person of ordinary skill in the art may make variations and modifications without departing from the concept and scope of the disclosure. Therefore, the protection scope of the disclosure should be subject to the claims.

What is claimed is:

1. An optical switch module, applied to an input device, the optical switch module comprising:
    a light generation circuit, comprising a light generation unit and a control end, the light generation unit generating light according to a control signal from the control end;
    a light receiving circuit, comprising a light receiving unit and a signal reading end, the light receiving unit being configured to receive light from the light generation unit to generate a detection signal at the signal reading end; and
    a control unit, electrically connected to the control end and the signal reading end, configured to generate the control signal at the control end and receive the detection signal at the signal reading end, and the control unit further selectively configuring the signal reading end in an input mode or an output mode;
    wherein, before the control unit configures the signal reading end in the input mode to read the detection signal, the control unit configures the signal reading end in the output mode to pull up a potential of the light receiving unit,
    the control unit comprises a GPIO pin connecting to the signal reading end to configure the signal reading end in the input mode or the output mode.

2. The optical switch module according to claim 1, wherein the control unit activates the light generation unit to generate light through the control signal after the signal reading end is configured in the input mode.

3. The optical switch module according to claim 1, wherein the light generation unit is an infrared light-emitting diode.

4. The optical switch module according to claim 1, wherein the light receiving unit is a phototransistor.

5. The optical switch module according to claim 1, wherein the light generation circuit further comprises a switching element, the switching element comprises a first end, a second end, and a third end, the first end is electrically connected to a power supply end, the second end is electrically connected to the control end, the third end is electrically connected to the light generation unit; and the switching element is controlled by the control signal, to selectively transmit power of the power supply end to the light generation unit.

6. The optical switch module according to claim 5, wherein the light generation circuit further comprises a first resistor, and two ends of the first resistor are electrically connected to the third end and a high-voltage end of the light generation unit respectively.

7. The optical switch module according to claim 1, wherein the light receiving circuit further comprises a second resistor, two ends of the second resistor are electrically connected to the light receiving unit and the power supply end respectively, and the signal reading end is connected to a node between the second resistor and the light receiving unit.

8. A optical switch module control method, applied to an optical switch module, wherein the optical switch module comprises a light generation circuit and a light receiving circuit, the light generation circuit comprises a light generation unit and a control end and generates light according to a control signal from the control end, and the light receiving circuit comprises a light receiving unit and a signal reading end and is configured to receive light from the light generation unit to generate a detection signal at the signal reading end,
    wherein the control unit comprises a GPIO pin connecting to the signal reading end to configure the signal reading end in the input mode or the output mode,
    the control method comprising:
    configuring the signal reading end in an output mode to pull up a potential of the light receiving unit;
    configuring the signal reading end in an input mode to prepare to read the detection signal;
    activating the light generation unit through the control signal to generate light;
    reading the detection signal through the signal reading end to determine a key state, after the light receiving unit reaches a steady state; and
    switching off the light generation unit.

* * * * *